United States Patent
Buettgen et al.

(10) Patent No.: US 9,343,607 B2
(45) Date of Patent: May 17, 2016

(54) PN-STRUCTURED GATE DEMODULATION PIXEL

(71) Applicant: MESA Imaging AG, Zurich (CH)

(72) Inventors: Bernhard Buettgen, Adliswil (CH); Michael Lehmann, Winterhur (CH); Miguel Bruno Vaello Paños, Zurich (CH)

(73) Assignee: Heptagon Micro Optics Pte. Ltd., Singapore (SG)

(*) Notice: Subject to any disclaimer, the term of this patent is extended or adjusted under 35 U.S.C. 154(b) by 0 days.

(21) Appl. No.: 13/847,704

(22) Filed: Mar. 20, 2013

(65) Prior Publication Data
US 2013/0248938 A1    Sep. 26, 2013

Related U.S. Application Data

(60) Provisional application No. 61/613,363, filed on Mar. 20, 2012.

(51) Int. Cl.
| | | |
|---|---|---|
| *H01L 27/148* | (2006.01) | |
| *H01L 29/768* | (2006.01) | |
| *H01L 31/112* | (2006.01) | |

(Continued)

(52) U.S. Cl.
CPC ...... *H01L 31/1125* (2013.01); *H01L 27/14603* (2013.01); *H01L 27/14614* (2013.01); *H01L 27/14643* (2013.01); *H01L 29/4983* (2013.01); *H01L 31/1804* (2013.01)

(58) Field of Classification Search
CPC .............. H01L 31/1125; H01L 27/14614; H01L 27/14643; H01L 29/4983
USPC ................................. 257/229, 290
See application file for complete search history.

(56) References Cited

U.S. PATENT DOCUMENTS

| 7,884,310 B2 | 2/2011 | Buettgen |
| 8,115,158 B2 | 2/2012 | Buettgen |

(Continued)

FOREIGN PATENT DOCUMENTS

EP    1 777 747 A1    4/2007

OTHER PUBLICATIONS

Webster's II New Riverside University Dictionary, HoughtonMifflin Co., 1994, p. 837.*

(Continued)

*Primary Examiner* — Howard Weiss
(74) *Attorney, Agent, or Firm* — Fish & Richardson P.C.

(57) ABSTRACT

A novel photo-sensitive element for electronic imaging purposes and, in this context, is particularly suited for time-of-flight 3D imaging sensor pixels. The element enables charge-domain photo-detection and processing based on a single gate architecture. Certain regions for n and p-doping implants of the gates are defined. This kind of single gate architecture enables low noise photon detection and high-speed charge transport methods at the same time. A strong benefit compared to known pixel structures is that no special processing steps are required such as overlapping gate structures or very high-ohmic poly-silicon deposition. In this sense, the element relaxes the processing methods so that this device may be integrated by the use of standard CMOS technology for example. Regarding time-of-flight pixel technology, a major challenge is the generation of lateral electric fields. The element allows the generation of fringing fields and large lateral electric fields.

9 Claims, 11 Drawing Sheets

(51) Int. Cl.
*H01L 31/18* (2006.01)
*H01L 27/146* (2006.01)
*H01L 29/49* (2006.01)

(56) References Cited

U.S. PATENT DOCUMENTS

| | | | |
|---|---|---|---|
| 8,227,844 B2* | 7/2012 | Adkisson et al. | 257/292 |
| 8,299,504 B2 | 10/2012 | Seitz | |
| 2006/0118835 A1* | 6/2006 | Ellis-Monaghan et al. | 257/292 |
| 2007/0158770 A1 | 7/2007 | Kawahito | |
| 2009/0179232 A1 | 7/2009 | Adkisson et al. | |
| 2011/0292380 A1 | 12/2011 | Bamji | |

OTHER PUBLICATIONS

Karnik, Sooraj V., "Lateral polysilicon p+-p-n+ and p+-n-n+ diodes", Solid-State Electronics 47, available online at www.sciencedirect.com, 2002, pp. 653-659.

Ker, Ming-Dou, et al, "Design of Negative Charge Pump Circuit with Polysilicon Diodes in a 0.25-um CMOS Process," 0-7803-7363-4/02, IEEE, © 2002, pp. 145-148.

Radovanovic, S., et al, "High-speed lateral polysilicon photodiode in standard CMOS technology," 33rd Conference on European Solid-State Device Research, ESSDERC 2003, Sep. 16-18, 2003, Lisboa, Portugal, 4 pages.

Spickermann, A., et al, "CMOS 3D image sensor based on pulse modulated time-of-flight principle and intrinsic lateral drift-field photodiode pixels," ESSCIRC, 2011, pp. 111-114.

Teranishi, Nobukazu, et al, "No image lag photodiode structure in the interline CCD image sensor", IEEE, 1982, pp. 324-327.

Tubert, Cedric, et al., "High Speed Dual Port Pinned-photodiode for Time-of-Flight Imaging," IISW, 2009. In 0153.0013, 3 pages.

International Search Report and Written Opinion of the International Searching Authority mailed on Jun. 3, 2013, from counterpart International Application No. PCT/IB2013/000422, filed Mar. 20, 2013.

International Preliminary Report on Patentability mailed on Oct. 2, 2014, from counterpart International Application No. PCT/IB2013/000422, filed Mar. 20, 2013.

* cited by examiner

Prior Art

Fig. 1

Prior Art

Fig. 2

Prior Art

Fig. 3

Prior Art

Fig. 4

Prior Art

PN-STRUCTURED GATE DEMODULATION PIXEL

RELATED APPLICATIONS

This application claims the benefit under 35 U.S.C. §119 (e) of U.S. Provisional Application No. 61/613,363, filed on Mar. 20, 2012, which is incorporated herein by reference in its entirety.

BACKGROUND OF THE INVENTION

In general, two different types of devices have been used for the photo-detection in the charge domain in the past: the first type is a pinned photodiode (PPD) (see, e.g., Nobukazu Teranishi et al, "No image lag photodiode structure in the interline CCD image sensor", IEEE, 1982), which is available today in most complementary metal-oxide semiconductor (CMOS) process technologies, and the second type use MOS gate structures, which may be fabricated in CMOS technology or in an optimized charge-coupled device (CCD) technology.

Figure 1:
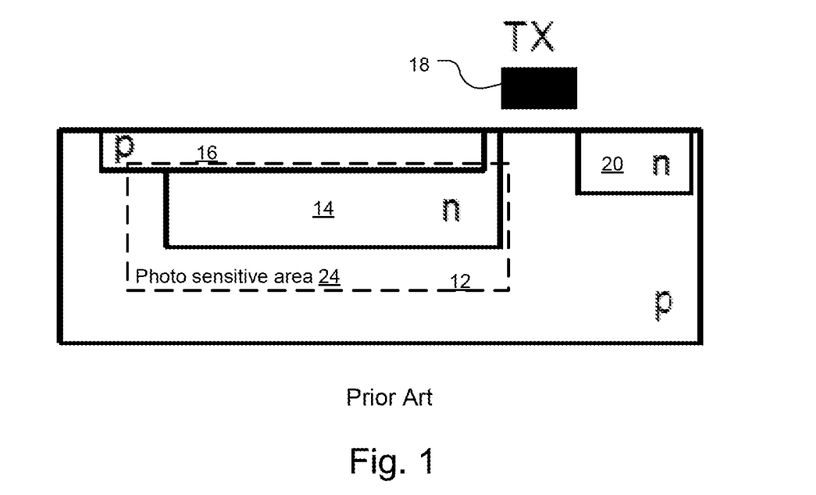
FIG. 1 is a schematic cross-sectional view showing a conventional pinned photodiode (PPD) including a sense node implant.

A pinned photodiode generally has two implants in the substrate, the doping concentrations of which are chosen in such a way that a fully depleted area is created beneath a very shallow non-depleted layer at the substrate surface. With reference to FIG. 1, if the substrate 12 is supposed to be p-doped, the two implant steps comprise a deep n− implant 14 and a shallow p+ implant 16, where the p+ extends laterally beyond the n− layer in order to create an electrical connection to the substrate 12. At one side of the structure, a poly-silicon gate 18 is placed that enables the transfer of the charges out of the PPD region 14 to a sense node diffusion 20. The region around the so-called transfer gate as well as the gate itself is usually optimized with regard to the charge transport process. The pinned region 14 defines the photo-sensitive area 24 where photons are converted into electric charges. As long as the transfer gate 18 is set to low potential, then the photo-generated charges are stored within the PPD region 14.

Figure 2:
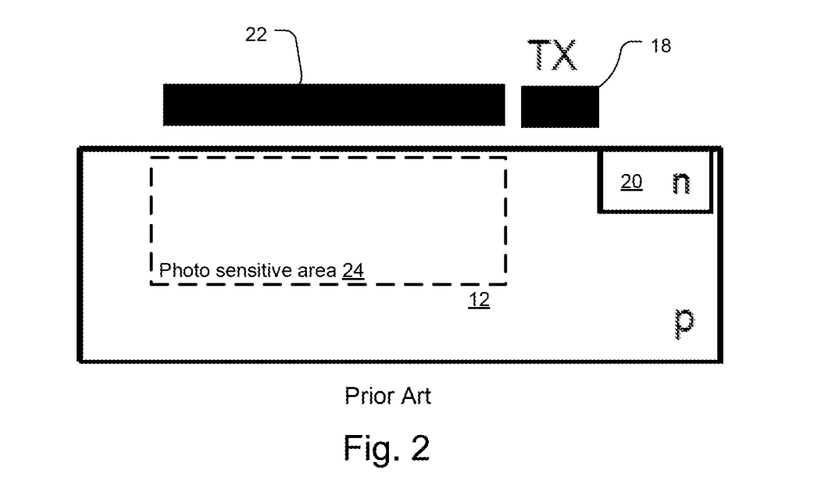
FIG. 2 is a schematic cross-sectional view showing a conventional MOS gate pixel including a sense node implant.

With reference to FIG. 2, MOS gate structures usually apply a poly-silicon gate 22, which should be generally photo-transparent at least for the wavelength of interest or at least long wavelengths >500 nanometers (nm). Photons create electric charges in the area 24 of the substrate 12 beneath the gate 22 where they may be stored unless the adjacent transfer gate 18 opens the channel either to another storage gate region or to a sense node 20, as shown. While the sense node 20 is typically integrated in each pixel separately when using CMOS processes, there is only one sense node and several storage and shift registers when using CCD technology. However, the principle of the photo-sensitive element is the same in either case.

Figure 3:
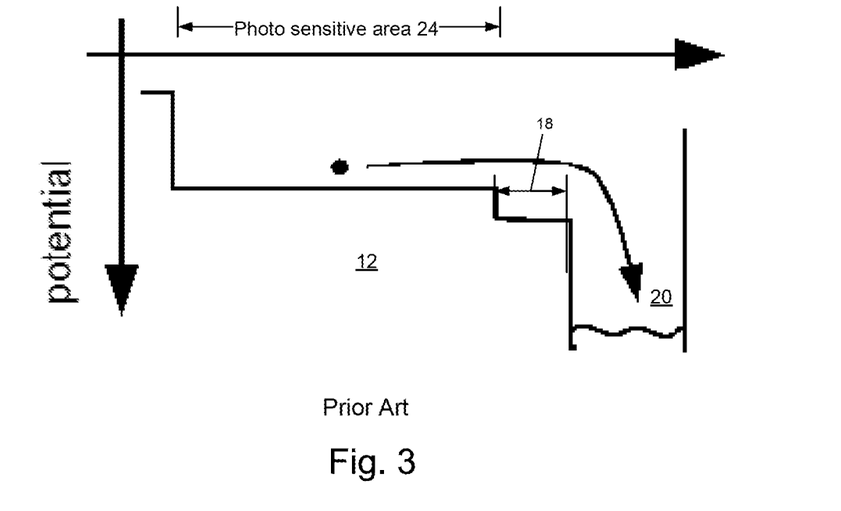
FIG. 3 shows the potential distribution for PPD as well as MOS gate structure when the transfer gate is set to high potential level in order to transfer charge from the photo sensitive region towards the sense node.

Both types of charge domain photo-detection devices have the same drawbacks in terms of the charge handling. If the charge needs to be transferred from one photo-detecting element to another storage or sense region, the efficiency of this kind of transport process is highly dependent on the electric fields supporting this process. In extreme conditions, which are particularly the case for larger pixel sizes of, for example, greater than 1 micrometer, the photo-detecting regions do not exhibit effective lateral electric fields supporting the charge transport towards the sense node. This situation is depicted in FIG. 3 for the case that the transfer gate is set to high potential level. Due to a flat potential distribution within the sensitive region 24, single electric charges are transported to the sense node 20 by thermal movement processes, which may be some orders of magnitude slower than charge movement due to electric fields.

A first solution to accelerate the charge transport has been disclosed in U.S. Pat. No. 8,299,504 B2 by Seitz. A single high-resistive gate creates a lateral drift field by a current flowing through the gate itself. This approach has been verified in practice. However, large pixel arrays consume significant amount of power due to the permanent resistive losses plus additional capacitive losses when being operated in a dynamic mode of operation.

Another possible solution to accelerate the charge transport has been disclosed in U.S. Pat. No. 8,115,158 B2 by Buettgen, which is incorporated herein by this reference in its entirety.

Figure 4:
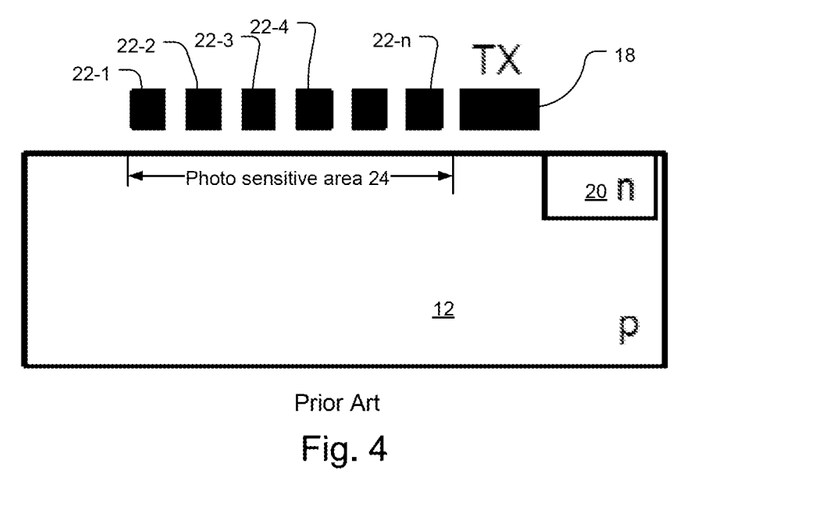
FIG. 4 is a schematic cross-sectional view showing a gate chain based approach for generating increasing potential distribution towards the sense node.
Figure 5:
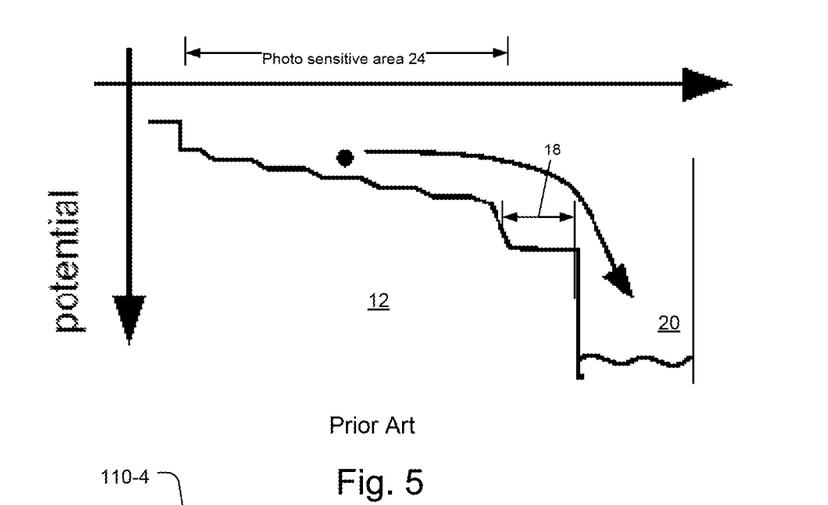
FIG. 5 shows the potential distribution with an increasing potential generated by gate chain enforcing accelerated charge transport.

As shown in FIG. 4, instead of a single gate across the photo-sensitive area, several adjacent gates 22-1 to 22-n are used to form a gate chain of small and narrow gates above the photosensitive area 24. By applying increasing voltages on the gates 22-1 to 22-n, a potential distribution as shown in FIG. 5 is generated. This method has proven its efficiency in practice. Compared to the method of U.S. Pat. No. 8,115,158 B2 no permanent power consumption is expected.

The potential distribution with the semiconductor material 12 ideally looks as shown in the FIG. 5. The potential increase between two gates is ideally positive. However, this depends on the potential steps applied between adjacent gates 22 and the space between two gates 22-x and 22-(x+1). The closer the gates are located to each other, the more unlikely is the generation of any potential bumps between two gates. That is the reason why in CCD processes overlapping gate structures are used where the gate-to-gate distances are typically in the nanometer range.

Concerning the PPD pixel several approaches have been studied to accelerate the charge transport. The first example consists of a shaping of the n− implant layer in order to achieve a kind of pinning voltage modulation over space. This is described in Cedric Tubert et al, "High Speed Dual Port Pinned-photodiode for Time-of-Flight Imaging", IISW, 2009. Another approach exploits a spatial pinning voltage modulation by applying a doping gradient for the n− implant. This is presented for example in A. Spickermann et al, "CMOS 3D image sensor based on pulse modulated time-of-flight principle and intrinsic lateral drift-field photodiode pixels", ESSCIRC, 2011.

All PPD-based methods have as common drawback: the total inflexibility in terms of drift voltage control compared to the gate-based approaches because the pinning voltages are pre-determined by the doping concentrations and cannot be controlled from external source. This makes PPD pixels unattractive in many applications. Concerning the speed enhancement approaches, any spatial modulation of the pinning voltage goes hand in hand with a modulation of the sensitivity as well. Minimization of potential bumps and step-wise approximations of ideal potential distribution functions are an important concern. Special graymasks or several implant steps must be supplied by the foundry, which is rather unusual for standard imaging processes.

Regarding the gate-based approaches, special requirements to the processing technologies are set here as well: very high resistive gate must be used to hold the power consumption as low as possible, or narrow gate gaps or even overlapping gates are necessary in order to avoid potential bumps between adjacent gates. The discretization of the potential gradient by the use of several gates always leads to a step function but never to a perfect constant gradient.

SUMMARY OF THE INVENTION

The disclosed structure enables the creation of electric drift fields while avoiding the afore-mentioned drawbacks of either PPD or gate-based approaches. For example, in some cases special requirements to the process in terms of narrow gates, overlapping gates, multi-implant step or graymask can be avoided while also avoiding potential bumps from one storage region to the next one along with a step-wise approximation of an ideal constant electric field distribution.

The present invention concerns the creation of the drift field in a demodulation or time-of-flight pixel. Instead of using separated gates by using either CCD-like overlapping gates or narrow-spaced gates—both techniques requiring changes in the typical process—separated semi-isolated areas are created by doping a big poly-silicon gate, for example. The different doping regions are separated from each other via a pn-junction. Therefore this technique is called PN-Structured Gate.

It should be noted that while the PN-structured gate is described in the context of a poly-silicon material system, other semiconductor materials are possible and not excluded.

In general, according to one aspect, the invention features a demodulation pixel, comprising a substrate in which photocharges are generated and a gate layer over the substrate having one or more p-n junctions.

In embodiments, the gate layer is formed in a layer, such as polysilicon, that is deposited on top of an isolation or insulation layer on the substrate. Usually a sense node is located adjacent to the gate layer. This allows the movement of photocharges using toggle gates and integration gates. These have opposite doping types.

In one embodiment, the gate layer forms a drift and photosensitive part. The drift and photosensitive part provides photocharges to a demodulation part.

In general according to another aspect, the invention also features a method for fabricating a demodulation pixel, comprising: depositing a gate layer over a substrate in which photocharges are to be generated and doping the gate layer to have one or more p-n junctions.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 6:
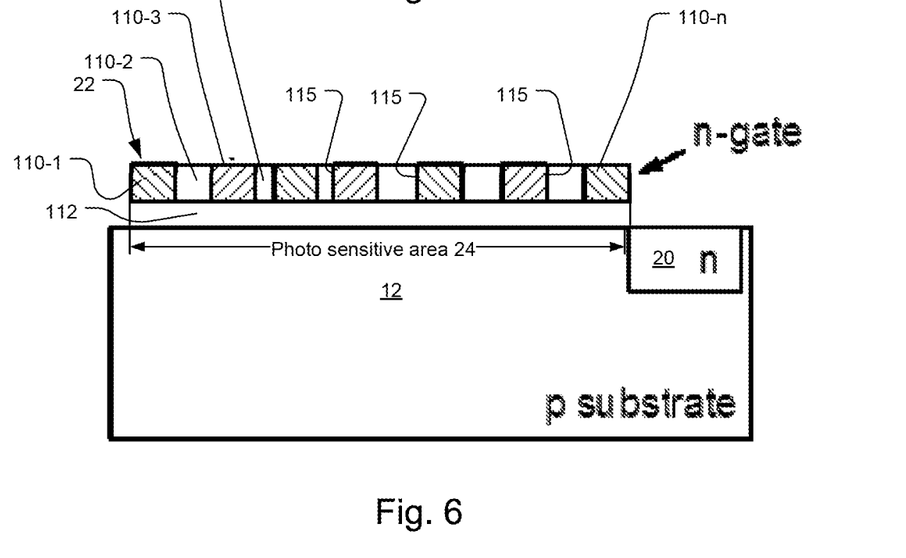
FIG. 6 is a schematic cross-sectional view showing a single pn-structured gate.

The fundamental idea is shown in FIG. 6 incorporating an arbitrary arrangement according to one implementation of the invention. A p-type substrate 12 is used, in the specific illustrated example. In other examples, a n-type substrate is used, however. A gate 22 is deposited and then patterned on the substrate 12 and electrically isolated from the substrate via an insulating layer 112.

The single gate 12 is structured to have n- and p-doped areas 110-1 to 110-n, where the distances between those areas may vary from zero up to several micrometers. By applying appropriate voltages to the n- and/or p-gate regions 110-1 to 110-n, a CCD-like control of the voltage distribution is achieved, which enables a CCD-like charge transport in the semiconductor bulk material 12. The every one of the areas between the n- and p-doped regions, or only a few, are lowly n- or p-type doped or intrinsic in some examples. (A few of these areas or interfaces are denoted by reference numeral 115 in FIG. 6.)

In the example, an n-doped sense node 20 is used. It is used to sense photo-generated charges but also to deplete the photosensitive region 24 during a reset phase.

On other embodiments, a buried channel is added. This involves another re-implant beneath the gate 22 and in the photosensitive region 24.

Figure 7:
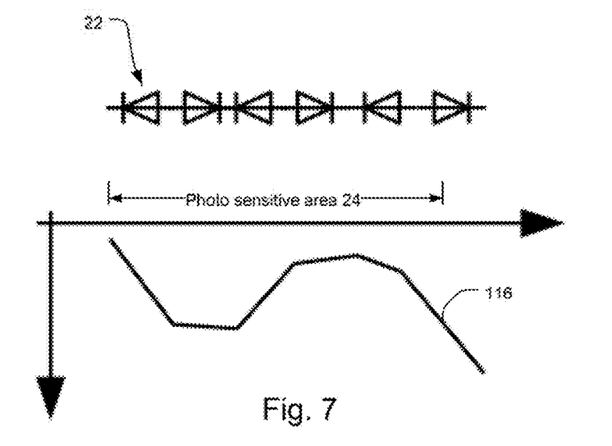
FIG. 7 is a modeling of the gate by a series connection of oppositely directed diodes and an example for the generation of arbitrary potential distributions by appropriate diode biasing.

The pn-structured gate 22 can be modeled as series of diodes as shown in FIG. 7. An arbitrary voltage distribution 116 is shown, which is created by setting the diodes of the gate 22 to appropriate voltages. Currents through the gate 22 are avoided due to the fact that in any case at least one pre junction within the current path is in reverse bias mode of operation.

Poly-silicon layers with pn-diode structures are known. Diode characteristics have been measured depending on grain size of the poly-silicon material and optical characteristics have been exploited, see, e.g., Sooraj V. Karnik, "Lateral polysilicon p+-p-n+ and p+-n-n+ diodes", Solid-state electronics, available online at www.sciencedirect.com, 2002; Ming-Dou Ker et al, "Design of Negative Charge Pump Circuit with Polysilicon Diodes in a 0.25-um CMOS Process"; and S. Radovanovic et al, "High-speed lateral polysilicon photodiode in standard CMOS technology". None of the existing publications, however, proposes poly-silicon gate with a dedicated two-dimensional pn-structuring for the control of the charge flow within the semiconductor material by adding several pn diodes in opposite directions together.

Figure 8A:
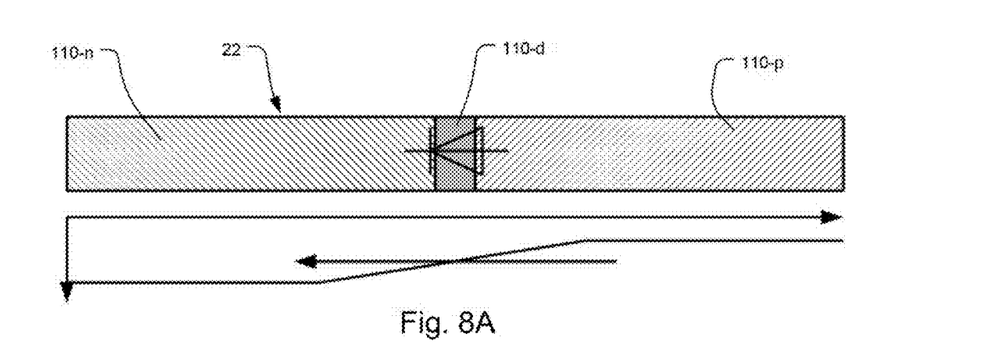
FIGS. 8A and 8B show the potential distribution in a pn-junction in reverse bias condition and in a forward bias condition, respectively.

If the gate 22 is completely doped, the gate is set up as shown FIG. 8A. If both n-region 110-n as well as p-type region 110-p are contacted from outside, then the n-type area must not be more than Vdiode ~0.3V below adjacent p-type areas, otherwise a high current would start to flow. A forward-biased diode would be realized.

In reverse-biased mode large voltage differences between n- and p-type regions may be applied, where the higher voltage is put to the n-type region. Only leakage currents are expected to flow as long as the voltage does not exceed the breakdown voltage. This characteristic voltage level is strongly depending on the characteristics of the diode such as grain size of the poly-silicon material, doping concentrations and distance between n- and p-type regions.

Figure 8B:
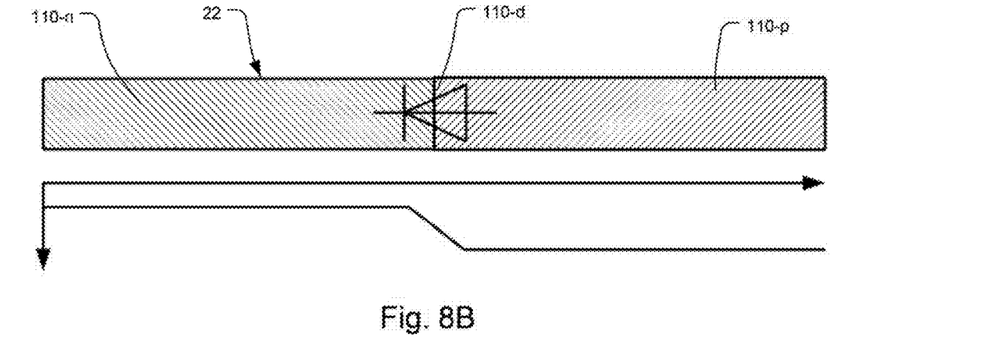

FIG. 8A shows the voltage distribution for a reverse biased pn junction with large depletion width 110-d. FIG. 8B shows the diode in forward bias situation, where the depletion width is smaller accordingly.

Using n+/p+ drain/source doping in a CMOS process might lead to Zener diode characteristics, where reverse biasing would result in a significant current flow. This must be considered in the design of the diode by probably inserting a certain space in-between the n- and p-type regions. In this case actually a PIN diode would be realized, where the layer between the n- and p-doped regions is non-doped, possibly intrinsic silicon material. Also several extra doping steps are used in some examples.

Figure 9:
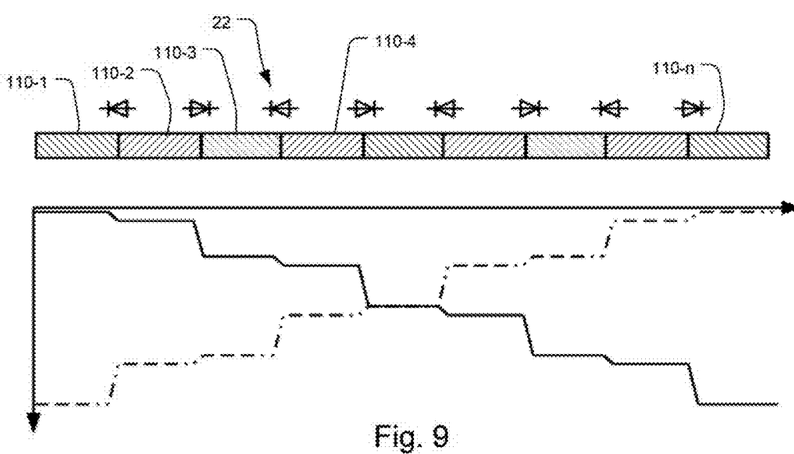
FIG. 9 shows the potential distribution for un-evenly distributed drift field potentials.

The concept for creating a drift field with the pn-structured gate technique is shown in FIG. 9. A drift gate of equally sized n-doped regions (110-1, 110-3, . . . ) and p-doped regions (110-2, 110-4, . . . ) is shown. Making sure that Vn>Vp-Vdiode, no significant current flow is expected. This can be realized by contacting each region and applying appropriate voltages according to the condition above. Another possibility is to contact every second gate region and applying to them increasing voltages.

Figure 10:
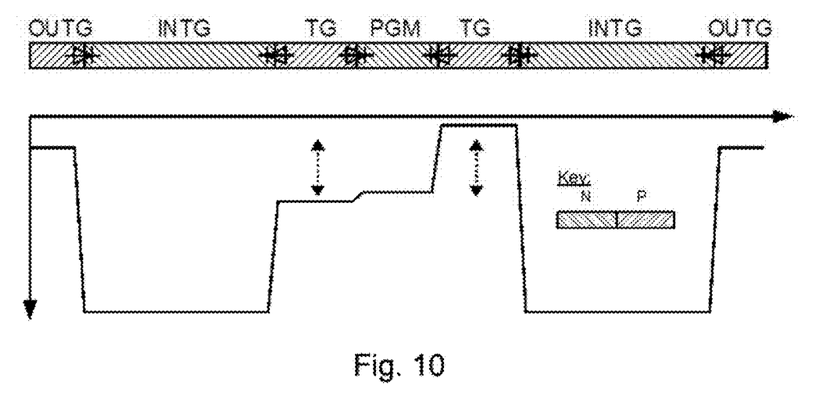
FIG. 10 is a schematic cross-sectional view of a demodulation region with n-type PGM and single p-type toggle gates and the potential distribution.

FIG. 10 illustrates a demodulation region in time-of-flight pixel, according to an embodiment of the invention. It generally has a number of gates that are driven at high frequencies, usually in the MegaHertz range up to GigaHertz. They are called toggle gates TG. Typically there are two or more toggle gates TG. In the illustrated example, the toggle gates TG are constructed from p-doped polysilicon. Furthermore, the demodulation region further preferably includes a n-doped middle photogate PGM, n-doped integration gates INTG as well as p-doped outgate OUTG. While the integration gates INTG act as storage elements, the outgates OUTG are used to decouple the integration regions from a sense node region.

The example embodiment shows two toggle gates TG on either side of the middle photogate PGM, integration gates INTG and outgates OUTG. The demodulation process, thus, delivers 2 output samples.

In this sketch there is no gap between n-type and p-type regions of the gates, which, however, may be applied according to this invention. The demodulation of the charge flow takes place in the region of the middle three gates PGM and TG by toggling the TG gates according to the sampling function illustrated by the plot of the potential distribution. Charge will flow to one of the two integration gates and be stored therein.

The integration gates INTG are the gates with the highest potential during integration, for example 5V. That is the reason why n-type poly-silicon has been chosen for them in this figure. The outgates OUTG have a relative low potential, for example 1V, to build the barrier between the integration gate and the sense node. Therefore p-type poly-silicon is used. Starting with this configuration. FIG. 10 also shows the potential distribution during integration and demodulation phases.

Figure 11:
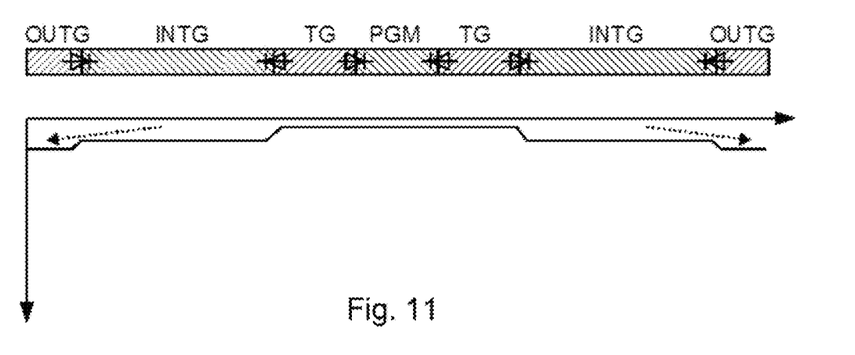
FIG. 11 is a schematic cross-sectional view of a demodulation region showing the potential distribution during shift, in which the integration gate potentials are lowered so that the charge flows over the outgates to the sense nodes.

In order to read out the integrated charges, they are transferred to the sense node during a so-called shift phase. In shift mode, the potentials are set as shown in FIG. 11.

Figure 12:
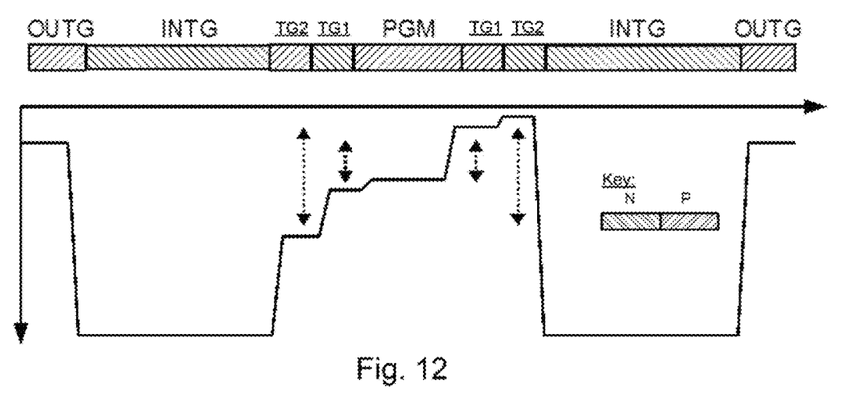
FIG. 12 is a schematic cross-sectional view of a demodulation region showing the potential distribution in the demodulation region with double toggle gates allowing higher potential steps between the PGM and the TGs.

FIG. 12 shows an alternative gate structuring allowing for even better demodulation performance, for some applications. The toggle gates TG1, TG2 have a double pn arrangement. Demodulation region with double toggle gates allows for higher potential steps between PGM and TGs.

Figure 13:
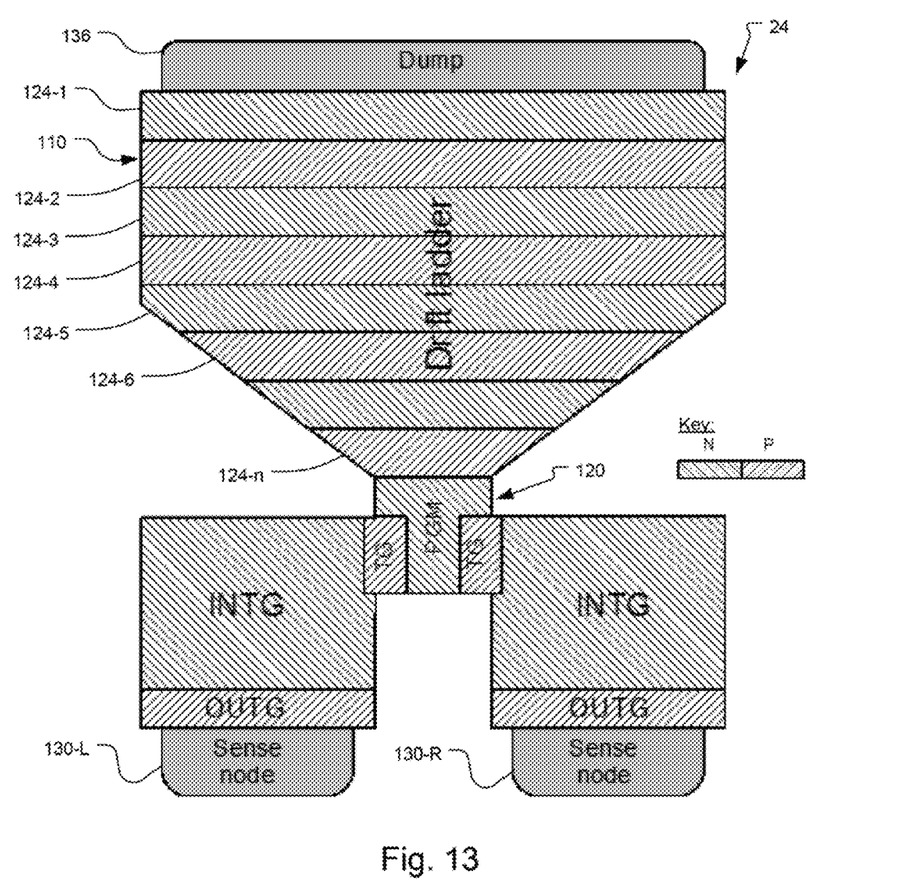
FIG. 13 is a schematic top view of a silo drift field pixel with pn-structured gates.

Drift field demodulation pixels as disclosed in incorporated U.S. Pat. No. 8,115,158 B2 have a drift and/or photosensitive part 24 and a demodulation part 120, as illustrated in FIG. 13. The drift and/or photosensitive part 24 has a triangular shape, due to which the pixel is often referred to as a silo pixel architecture. A single pn-structured gate 110 is formed in the photosensitive part 24 that comprises alternative bands of n-doped polysilicon 124-1, 124-3, 124-5 and p-doped poly silicon 124-2, 124-4, 124-6. The gate 110 is spaced and electrically insulated from the substrate by an insulating layer as shown in FIG. 6.

This structure in the drift part 24 passes photogenerated charge carriers formed in the underlying substrate to modulation part 120, that comprises a middle photogate PGM, and two (left, right) toggle gates TG. Thus photogenerated charge carriers are alternately stored into either of the left or right integration gates INTG. Once complete samples have been generated, the photogenerated charges integrated in each of the left or right integration gates INTG are passed to the respective left and right sense nodes 130-L, 130-R via the respective left and right out gates OUTG.

A dump node 136 is provided in which photogenerated charges may be flushed prior to a demodulation cycle.

Many standard processes offered by semiconductor chip fabs may not provide intrinsic poly-silicon deposition because a base doping concentration is added by default. Nevertheless, the source/drain diffusion step may still be used to define n-type and p-type regions.

Depending on the energy dose of the implant steps and the thickness of the gate, it might happen that the definition of one doping type does not affect the whole depth of the gate. In this case semi-doped gates result.

Figure 14:
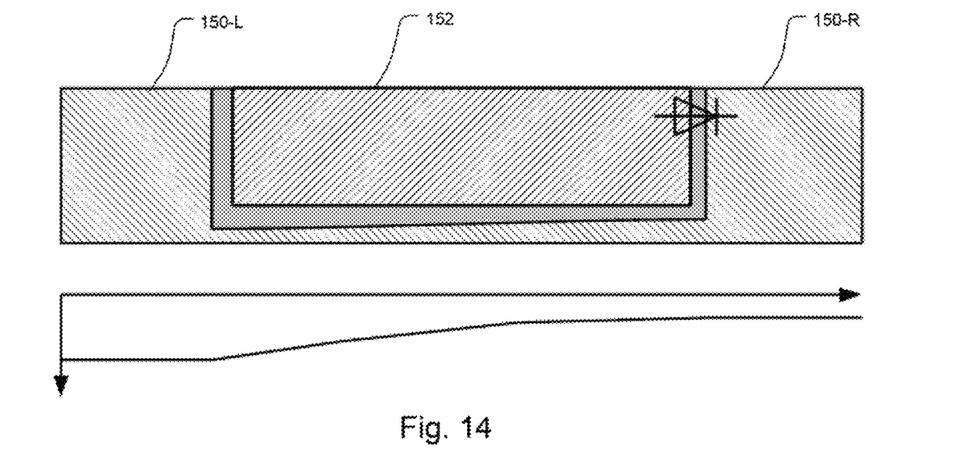
FIG. 14 is a schematic cross-sectional view showing semi-doped poly gates functioning similar to a JFET.

An example for n-type base doping of the gate 150 and p-type semi-doped region 152 is shown in FIG. 14. This is just an example, however, and the invention is not restricted to n-type base doping, also the opposite of p-type base doping is another option.

In this example the left n side 150-L is set to higher potential, e.g. 3V, than the right n side 150-R, e.g. 2V. The p-type region 152 is set to a lower potential, for example 1V. The functional principle is similar to a JFET device. Depending on the p-voltage, the channel below is more or less resistive. As a result a linear potential distribution is created at the bottom surface as shown in the figure.

The potential of the p-type poly-silicon 152 does not directly influence the potential in the substrate but modulates the resistance between two adjacent n-type islands 150-L, 150-R. This allows for very high-ohmic connections between n-type areas; the drift field can be implemented with a high-resistive gate.

The 'channel' is only resistive, when the potential difference is not too large. Otherwise the device may come into saturation and as a consequence the potential distribution is not linear anymore.

Figure 15:
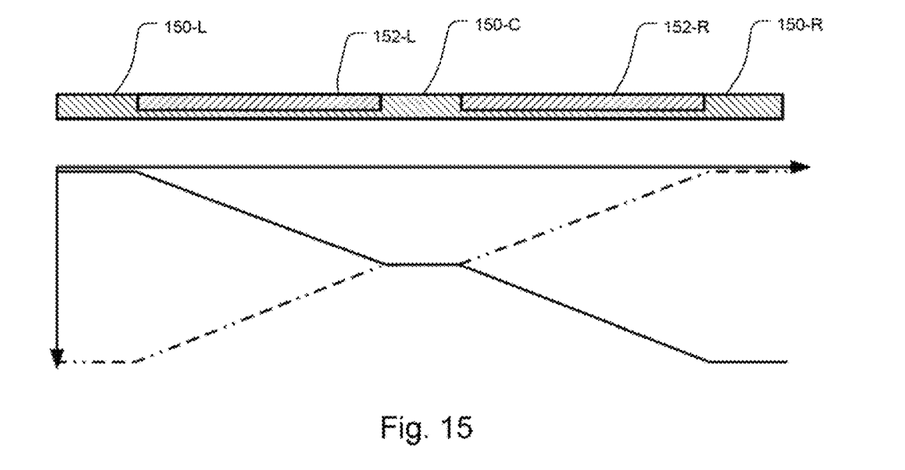
FIG. 15 is a schematic cross-sectional view showing a drift field region with semi-doped gate and the corresponding potential distribution.

FIG. 15 shows an example for generating a drift region by using two stages of p-type doping 150-L, 150-R to define three islands 150-L, 150-C, 150-R.

Figure 16:
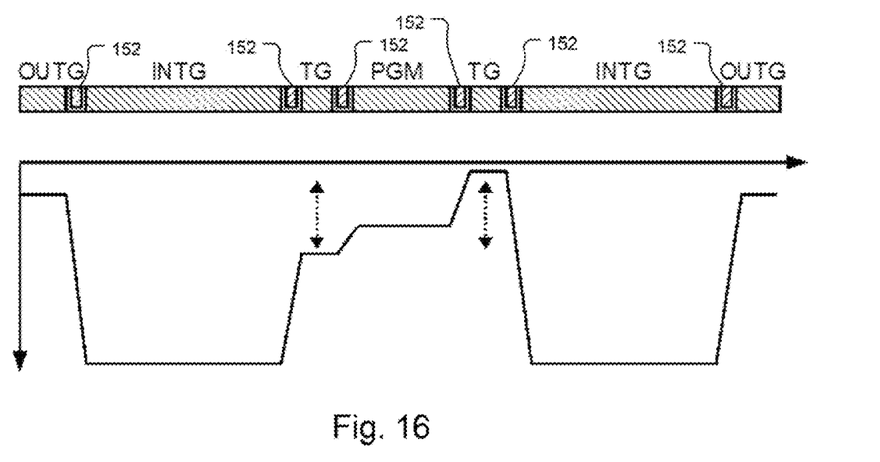
FIG. 16 is a schematic cross-sectional view showing a demodulation region with semi-doped gate and the corresponding potential distribution when p-type regions separate the gates from each other.

In the demodulation region of a pixel, shown in FIG. 16, the p-doped regions 152 are used to efficiently separate the different gates, separate the out gate OUTG from the integration gate INTG, separate the integration gate INTG from the toggle gate TG, and the toggle gate TG from the middle gate PGM. A very low potential is then applied to the p-doped regions 152. Here, the p-regions 152 should be as small as possible.

Figure 17:
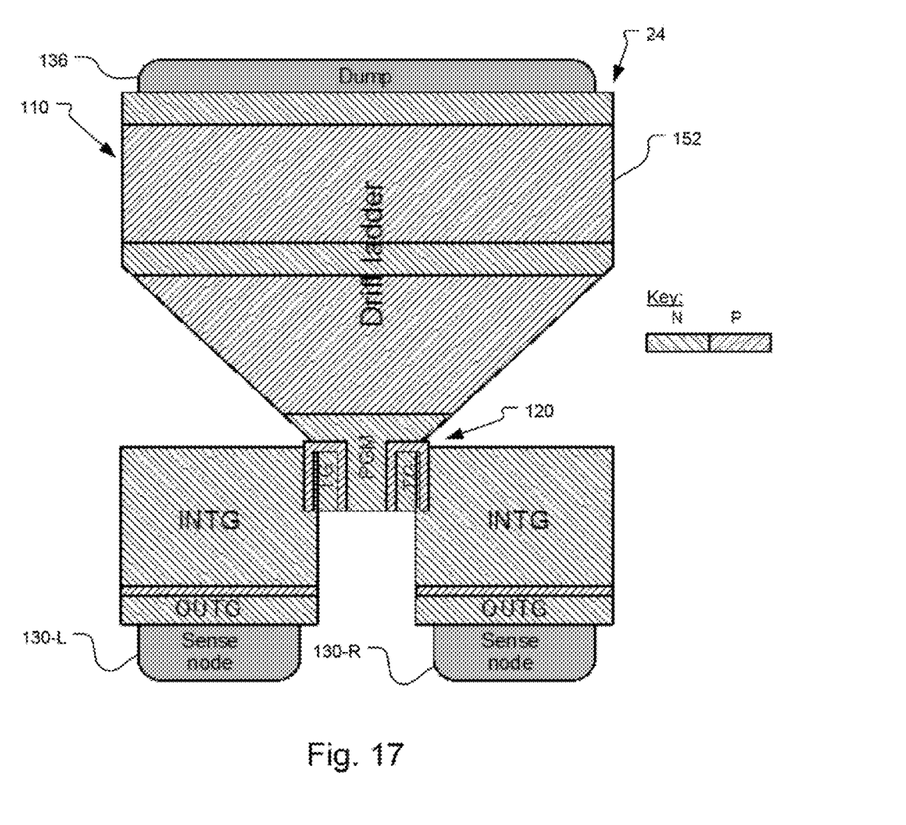
FIG. 17 is a schematic top view of a silo drift field pixel based on a semi-doped pn-structured gate.

FIG. 17 shows an example of a silo drift field pixel that combines the afore-presented embodiments for a drift field and a demodulation region based on semi-doped pn-structured gate.

A single pn-structured gate 110 is formed in the photosensitive part 24 that comprises p-doped regions 152. The gate 110 is spaced and electrically insulated from the substrate by an insulating layer as shown in FIG. 6.

This structure in the drift part 24 passes photogenerated charge carriers formed in the underlying substrate to modulation part 120, that comprises a middle photogate PGM, and two (left, right) toggle gates TG. Thus photogenerated charge carriers are alternately stored into either of the left or right integration gates INTG. Once complete samples have been generated, the photogenerated charges integrated in each of the left or right integration gates INTG are passed to the respect left and right sense nodes 130-L, 130-R via the respective left and right out gates OUTG.

Some more example embodiments of the invention are shown in the following.

Ideal Constant Drift Field generated with P-Intrinsic-N Structure

If we consider fully doped gates, one more flexibility for creating ideal constant drift fields is given. By pulling apart the n- and p-doped regions and creating lowly-doped or even totally undoped respectively intrinsic poly-silicon gate regions in-between, so-called PIN diode structures are created. The intrinsic region may be fully depleted and thus be used to create ideal constant drift fields of large lengths. There is a maximum length of intrinsic region, which depends on voltage levels, doping concentrations of n- and p-type regions, grain size of poly-silicon material etc. Several micrometers are realistic orders of length in any case.

Figure 18:
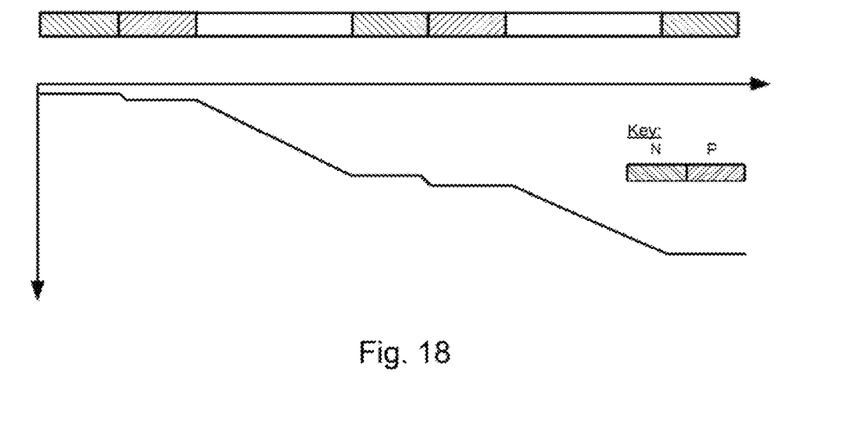
FIG. 18 is a schematic cross section showing the potential distribution for PN-structured gate with two intrinsic regions.

A first example of a pn-structured gate with two intrinsic regions is shown in FIG. 18.

Figure 19:
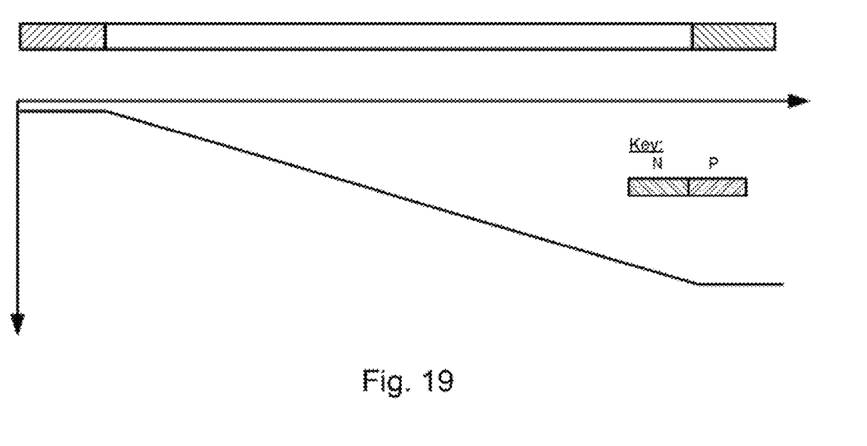
FIG. 19 is a schematic cross section showing the potential distribution for PN-structured gate with one large intrinsic region.

Another example of a pn-structured gate is shown in FIG. 19, where one large intrinsic region is used.

This concept works only if it can be assumed that the intrinsic region is not too large to get fully depleted.

Figure 20:
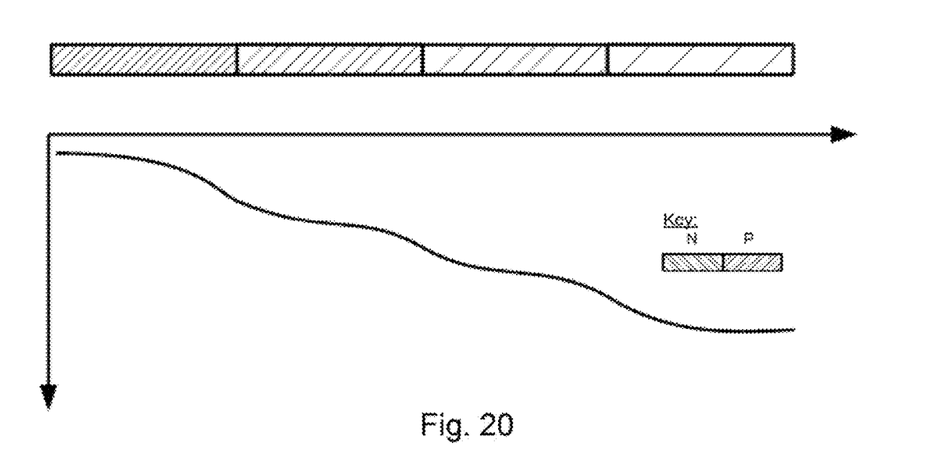
FIG. 20 is a schematic cross section showing the potential distribution for PN-structured gate with step-wise variation of the doping concentration to generate built-in drift fields.
Figure 21:
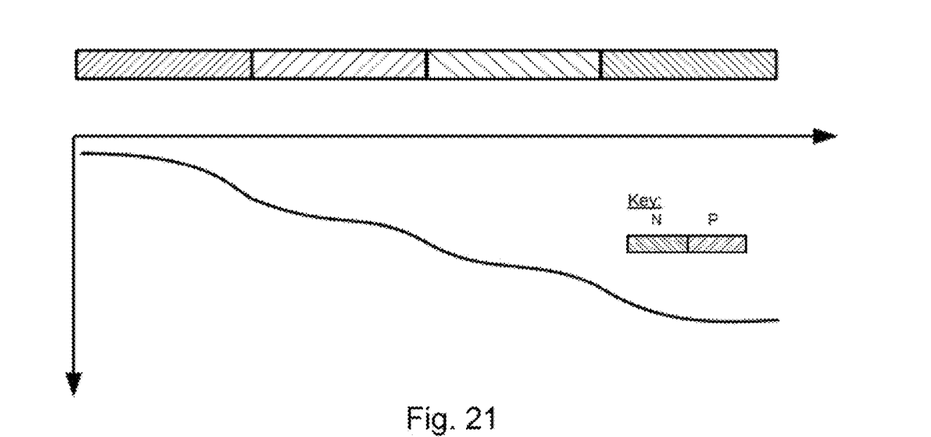
FIG. 21 is a schematic cross section showing the potential distribution for PN-structured gate with a n+/n−/p−/p+ doped gate.

If the process allows multi implant steps, then built-in drift fields can be realized by the exploitation of high-low junctions. An example is shown in FIG. 20. A further improvement might be achieved by pulling apart a little bit the implant regions so that the intrinsic regions in-between enable some kind of stretching of the potential drop from implant region to implant region. Graymasks would help too in order to realize different doping concentrations over space without requiring consecutive multi-implant steps.

Instead of exploiting intrinsic regions in-between p+ and n+ doped gate regions that allow for extending the depletion widths, another possibility might be using second-order weak implants of p– and n– regions. This is shown in FIG. 22.

The invention allows for combining the different example embodiments without any restriction. For example a drift region may have a gate structure with high-low junctions and PIN diodes at the same time.

While this invention has been particularly shown and described with references to preferred embodiments thereof, it will be understood by those skilled in the art that various changes in form and details may be made therein without departing from the scope of the invention encompassed by the appended claims.

What is claimed is:

1. A demodulation pixel, comprising:
    a substrate for generating photocharges therein, the substrate including a demodulation part having a photogate region and integration regions, the substrate further including sense node regions; and
    a gate layer over the substrate, the gate layer comprising a plurality of alternating p-doped and n-doped regions forming a series of p-n junctions in parallel to a surface of the substrate over which the gate layer is disposed and arranged to have different respective potentials applied to the p-doped and n-doped regions so as to generate a potential distribution in the substrate for transferring the photocharges alternately to different ones of the integration regions, and from the integration regions to respective ones of the sense node regions,
    wherein the p- and n-doped regions of the gate layer define a photogate, a respective toggle gate having a double p-n arrangement at each side of the photogate, a respective integration gate adjacent each of the toggle gates, and a respective decoupling gate adjacent each of the integration gates.

2. The demodulation pixel of claim 1 wherein respective voltages are applied to the p-doped and n-doped regions such that the p-n junctions are reverse biased.

3. The demodulation pixel of claim 1 wherein respective voltages are applied to the n-doped regions in an increasing manner.

4. The demodulation pixel of claim 1 wherein the p-doped and n-doped regions have substantially the same size as one another.

5. The demodulation pixel of claim 1 wherein the photogate and integration gates are n-doped regions of the gate layer, and the decoupling gates are p-doped regions of the gate layer.

6. The demodulation pixel of claim 5 wherein, during integration periods, the integration gates have an applied potential higher than potentials of the other gates.

7. The demodulation pixel of claim 5 wherein, during integration periods, the decoupling gates have a relatively low applied potential so as to provide a barrier to electron flow between each of the integration regions and its respective sense node region.

8. The demodulation pixel of claim 1 wherein the gate layer is composed of p-doped and n-doped poly-silicon.

9. The demodulation pixel of claim 1 further comprising:
a dump node operable to flush photogenerated charges prior to a demodulation cycle.

* * * * *